(12) United States Patent
Hayashi

(10) Patent No.: US 10,985,298 B2
(45) Date of Patent: Apr. 20, 2021

(54) LIGHT EMITTING DEVICE AND METHOD OF MANUFACTURING SAME

(71) Applicant: NICHIA CORPORATION, Anan (JP)

(72) Inventor: Tadao Hayashi, Tokushima (JP)

(73) Assignee: NICHSA CORPORATION, Anan (JP)

( * ) Notice: Subject to any disclaimer, the term of this patent is extended or adjusted under 35 U.S.C. 154(b) by 62 days.

(21) Appl. No.: 16/109,177

(22) Filed: Aug. 22, 2018

(65) Prior Publication Data

US 2019/0067537 A1    Feb. 28, 2019

(30) Foreign Application Priority Data

Aug. 25, 2017 (JP) ............................. JP2017-162274

(51) Int. Cl.
*H01L 47/00* (2006.01)
*H01L 33/58* (2010.01)
(Continued)

(52) U.S. Cl.
CPC .............. *H01L 33/58* (2013.01); *H01L 33/54* (2013.01); *H01L 33/60* (2013.01); *H01L 33/62* (2013.01); *H01L 33/0093* (2020.05); *H01L 33/0095* (2013.01); *H01L 33/32* (2013.01); *H01L 33/502* (2013.01); *H01L 33/507* (2013.01); *H01L 33/56* (2013.01); *H01L 2933/005* (2013.01); *H01L 2933/0033* (2013.01); *H01L 2933/0058* (2013.01); *H01L 2933/0083* (2013.01)

(58) Field of Classification Search
CPC ......... H01L 33/58; H01L 33/54; H01L 33/60; H01L 33/62; H01L 33/0079; H01L 33/0095; H01L 33/32; H01L 33/502; H01L 33/507; H01L 33/56

See application file for complete search history.

(56) References Cited

U.S. PATENT DOCUMENTS

2013/0320380 A1* 12/2013 Kanemaru .............. H01L 33/50
257/98
2015/0303356 A1   10/2015 Sanga et al.
(Continued)

FOREIGN PATENT DOCUMENTS

JP    2015-103632 A    6/2015
JP    2015-207615 A    11/2015
(Continued)

*Primary Examiner* — Victor A Mandala
*Assistant Examiner* — Colleen E Snow
(74) *Attorney, Agent, or Firm* — Global IP Counselors, LLP

(57) ABSTRACT

A light emitting device including a light emitting element, a light transmissive member, a light guide member, and a light reflective member. The light transmissive member is disposed on an upper surface of the light emitting element, and has a lower surface including a first region facing the light emitting element and a second region positioned outside of the first region. The light guide member covers a lateral surface of the light emitting element and the second region of the lower surface of the light transmissive member. The light reflective member covers the light emitting element, an upper surface of the light transmissive member and the light guide member. One of lateral surfaces of the light transmissive member is exposed from the light reflective member.

22 Claims, 5 Drawing Sheets

(51) Int. Cl.
    *H01L 33/60*    (2010.01)
    *H01L 33/62*    (2010.01)
    *H01L 33/54*    (2010.01)
    *H01L 33/50*    (2010.01)
    *H01L 33/32*    (2010.01)
    *H01L 33/56*    (2010.01)
    *H01L 33/00*    (2010.01)

(56) References Cited

U.S. PATENT DOCUMENTS

| | | |
|---|---|---|
| 2016/0276557 A1 | 9/2016 | Wada et al. |
| 2016/0348876 A1* | 12/2016 | Azuma ............... B29D 11/0074 |
| 2017/0033267 A1 | 2/2017 | Tamaki et al. |
| 2017/0229512 A1* | 8/2017 | Akagawa ............. G02B 6/0068 |

FOREIGN PATENT DOCUMENTS

| | | |
|---|---|---|
| JP | 2016-048718 A | 4/2016 |
| JP | 2016-178236 A | 10/2016 |
| JP | 2017-33967 A | 2/2017 |

\* cited by examiner

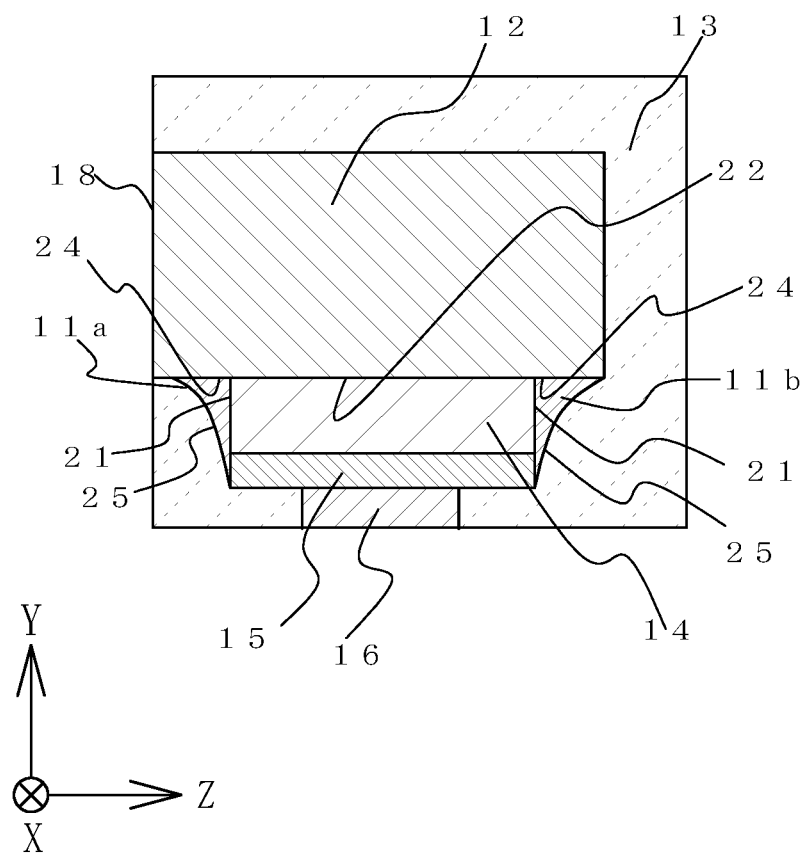

LIGHT EMITTING DEVICE AND METHOD OF MANUFACTURING SAME

CROSS-REFERENCE TO RELATED APPLICATION

This application claims priority to Japanese Patent Application No. 2017-162274, filed on Aug. 25, 2017, the disclosure of which is hereby incorporated by reference in its entirety.

BACKGROUND

The present disclosure relates to a light emitting device and method of manufacturing the same.

Japanese Unexamined Patent Application Publication No. 2016-48718 discloses a light emitting device a side-emission type light emitting device including: a flip-chip type light emitting element in which an element substrate, a crystal layer on the element substrate, outer electrodes electrically connected to the crystal layer are included; an optical member having a surface inclined to the outer electrodes, the optical member formed on the element substrate side of the light emitting element; a reflective layer formed on the inclined surface of the optical member. In such light emitting device, light emitted from the light emitting element and entering the optical member is reflected by the reflective member, and extracted from the light extraction surface of the optical member.

SUMMARY

The light emitting device disclosed in the above mentioned publication has a poor light emission efficiency due to a poor efficiency of light incident from the light emitting element to the optical member. In order to increase the light output, the light emitting element is needed to be larger, resulting in increase of the size of the light emitting device.

Certain embodiment of the present disclosure is intended to provide a side-emission type light emitting device with good emission efficiency.

A light emitting device according to certain embodiment of the present disclosure includes a light emitting element, a light transmissive member, a light guide member, and a light reflective member. The light transmissive member is disposed on an upper surface of the light emitting element, and has a lower surface including a first region facing the light emitting element and a second region positioned outside of the first region. The light guide member covers a lateral surface of the light emitting element and the second region of the lower surface of the light transmissive member. The light reflective member covers the light emitting element, an upper surface of the light transmissive member, and the light guide member. One of lateral surfaces of the light transmissive member is exposed from the light reflective member.

A method of manufacturing a light emitting device according to certain embodiment of the present disclosure includes: disposing a plurality of light emitting elements separated from each other; disposing a light transmissive member over adjacent two of the light emitting elements; disposing a light guide member covering lateral surfaces of the adjacent two of the light emitting elements, and a part of a lower surface of the light transmissive member; disposing a light reflective member covering the adjacent two of the light emitting elements, an upper surface of the light transmissive member, and the light guide member; and cutting the light guide member and the light reflective member between the adjacent two light emitting elements.

A method of manufacturing a light emitting device according to certain embodiment of the present disclosure includes: providing two light emitting elements disposed on a first surface of a light transmissive member; disposing a light guide member covering a part of the first surface of the light transmissive member, and lateral surfaces of the two light emitting elements; disposing a light reflective member covering the two light emitting elements, a second surface of the light transmissive member, and the light guide member; cutting the light transmissive member and the light reflective member between the two light emitting elements.

The light emitting device and the method of manufacturing the light emitting device according to certain embodiment of the present disclosure can realize a light emitting device with good emission efficiency.

BRIEF DESCRIPTION OF THE DRAWINGS

FIG. 3 is a schematic sectional view of a light emitting device of another embodiment.

DETAILED DESCRIPTION

Hereinafter, an embodiment will be appropriately described referring to drawings. However, a light-emitting device described below is provided for the purpose of embodying the technical concept described in the present disclosure, and unless specifically stated otherwise, the present disclosure is not limited to descriptions below. Also, the content of one embodiment and example can be applied to other embodiments and examples. There is a case where a magnitude, aspect ratio or positional relation of members illustrated in each drawing is exaggerated so as to clarify the description.

Figure 1:
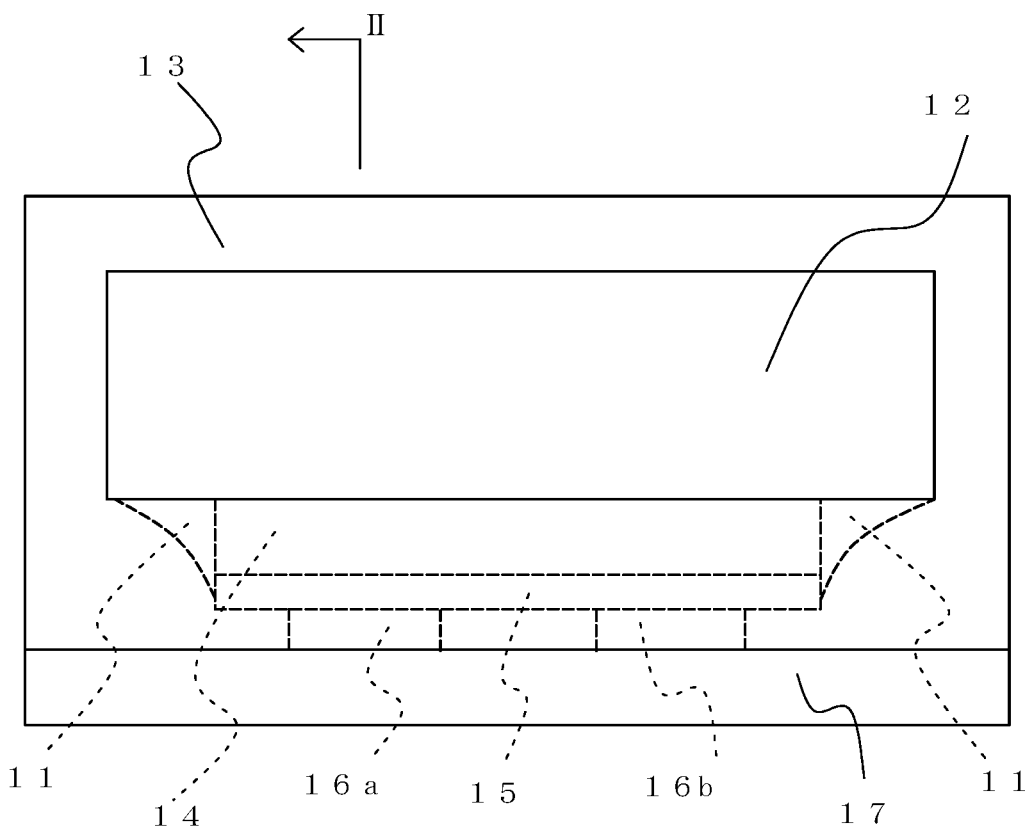
FIG. 1 is a schematic front view of a light emitting device of Embodiment 1.
Figure 2:
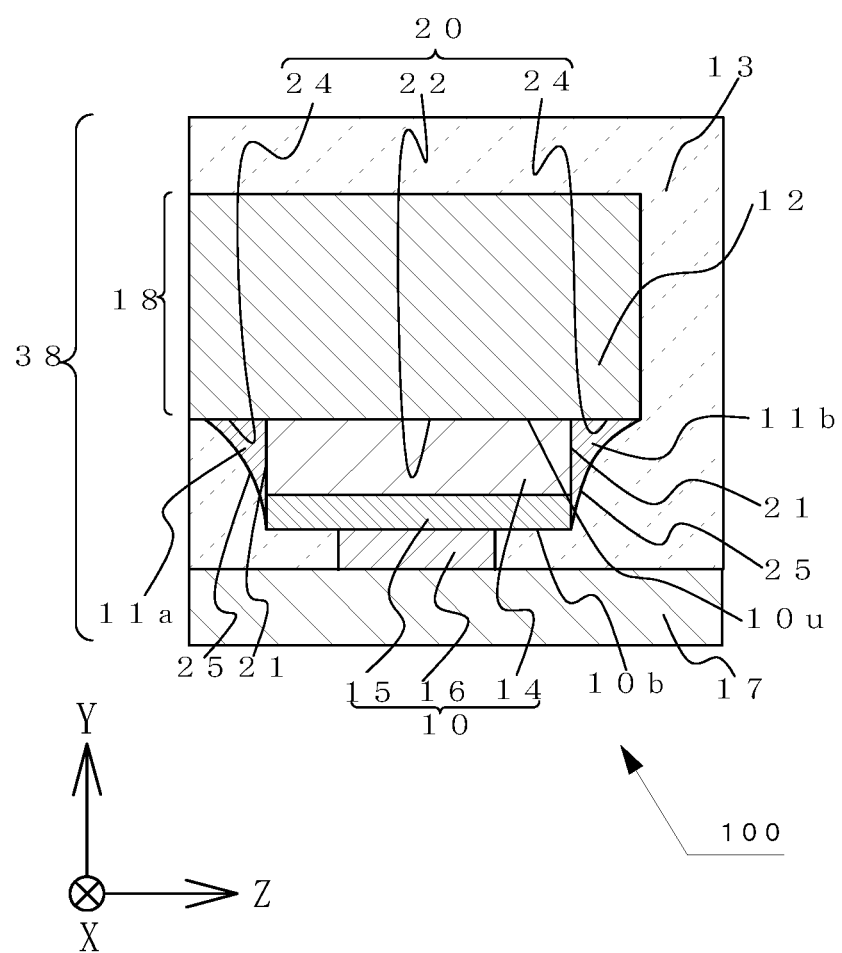
FIG. 2 is a schematic sectional view of the light emitting device taken along a line II-II in FIG. 1.

In FIGS. 1 to 3, an X direction, a Y direction and a Z direction perpendicular to one another are illustrated with allows. The present disclosure may refer to the X direction as a longitudinal direction, the Y direction as a thickness direction, the Z direction as a width direction.

The light emitting device has a rectangular-cuboid outer shape and has six outer surfaces including an upper surface, a tower surface which is opposite to the upper surface and serves as a mounting surface, four lateral surfaces between the upper surface and the lower surface. One of the lateral surfaces is configured with one surface of the light transmissive member exposed from the light emitting device. The surface of the light transmissive member exposed from the light emitting device serves as a light extraction surface, and referred to as a front surface in which the surface of the light transmissive member is included. A surface opposite to the front surface is also referred to as a back surface.

The term "downsizing" in the present disclosure means reducing the size of the light emitting device or the components thereof. Specifically, "thinning" means reducing the length in the thickness direction of the light emitting device. "Narrowed" means reducing the length in the width direction at the light emitting device.

FIG. 1 shows a front view of the light emitting device 100 in accordance with Embodiment 1 of the present disclosure. FIG. 2 shows a sectional view of the light emitting device taken along a line II-II in FIG. 1.

The light emitting device 100 according to certain embodiment includes a light emitting element 10, a light transmissive member 12, a light guide member 11, and a light reflective member 13.

The light transmissive member 12 is positioned on an upper surface 10u of the light emitting element 10 and the light guide member 11. A lower surface 20 of the light transmissive member 12 is configured with a first region 22 and the second region 24.

The light guide member 11 covers the lateral surfaces 21 of the light emitting element 10 and the second region 24 of the light transmissive member 12. The light reflective member 13 covers outer surfaces 25 of the light guide member 11, part of the lower surface 10b and part of the lateral surfaces of the light emitting element 10. The light reflective member 13 covers the lateral surfaces and the upper surface of the light transmissive member 12 except for the light extraction surface 18.

Light emitted from the upper surface 10u of the light emitting element 10 enters from the first region 22 of the light transmissive member 12 to the inside of the light transmissive member 12. Light emitted from the lateral surfaces 21 of the light emitting element 10 enters into the inside of the light guide member 11, followed by entering into the light transmissive member 12 from the second region 24. With this structure, the light guide member 11 covers the lateral surfaces 22 of the light emitting element 10 and the second region 24 of the light transmissive member 12. This allows light emitted from the lateral surfaces 21 to enter into the light transmissive member 12. Accordingly, the light from the light emitting element 11) can be efficiently enter into the light transmissive member 12 with less loss. A light emitting device with good emission efficiency can be obtained without increasing the size of the light emitting element 10.

The following describes a preferable embodiment of the light emitting device 100.

As shown in FIGS. 1 and 2, the light emitting device 100 according to certain embodiment includes a light emitting element 10 in which a light transmissive substrate 14, a semiconductor layered body 15, and a pair of electrodes 16 formed on a lower surface 10b of the semiconductor layered body 15 are included. A shape of an upper surface 10u of the light emitting element 10 can be appropriately selected, however, a quadrangular is preferable, or rectangular is more preferable. In the case where the upper surface 10u has a rectangular shape, a ratio of a length in the longitudinal direction to a length in the width direction is preferably 1.2 to 20, or 3 to 10 is more preferable. Specifically, the light emitting element 10 has a length in the longitudinal direction of from 200 µm to 2000 µm, a length in the thickness direction of from 10 µm to 300 µm, and a length in the width direction of from 100 µm to 500 µm. More preferably, a length in the longitudinal direction is from 500 µm to 1500 µm, a length in the thickness direction is 50 µm to 200 µm, and a length in the width direction is 100 µm to 400 µm. With this structure, the light emitting device 100 can be downsized, and light emitted from the upper surface 10u and the lateral surfaces 21 of the light emitting element 10 can be efficiently extracted to outside.

The light transmissive member 12 is disposed on the light emitting element 10 and the light guide member 11 to extract light, which has entered from the upper surface 10u of the light emitting element 10 and the light guide member 11, to outside from the light extraction surface 18.

In the light emitting device 100 according to the present embodiment, the light transmissive member 12 has a smaller area than the area of the light emitting element 10 in a top view. As shown in FIG. 2, the lateral surfaces 21 of the light emitting element 10 is positioned inner side than the lateral surfaces of the light transmissive member 12.

Positioning the lateral surfaces 21 of the light emitting element 10 inner side than the lateral surfaces of the light transmissive member 12 can have the second region 24. Having the second region 24 of the light transmissive member 12 allows the light guide member 11 to cover the second region 24. Accordingly, light entering from the lateral surfaces 21 of the light emitting element 10 to the light guide member 11 can efficiently enter the light transmissive member 12.

Preferably, the light transmissive member 12 is disposed on the light emitting element 10 such that the center in the X direction of the light emitting element 10 substantially coincides with the center in the X direction of the light transmissive member 12 along the Y direction in a front view. With this structure, light emitted from the light emitting element 10 can uniformly enter into the lower surface of the light transmissive member 12, thereby improving color non-uniformity. The light transmissive member 12 can be disposed on the light emitting element 10 such that the center in the Z direction of the light emitting element 10 substantially coincides with the center in the Z direction of the light transmissive member 12 along the Y direction in a sectional view, however, the positioning is not limited thereto. The center of the light transmissive member 12 can be positioned closer to the front surface or back surface than the center of the light emitting element 10. In other words, the light transmissive member 12 can be disposed on the light emitting element 10 such that the second region 24 can be provided in the front surface side and the back surface side.

The shape of the light transmissive member 12 in a front view can be appropriately selected, for example, substantially trapezoidal, substantially circular, or substantially semiellipsoidal shape, or substantially rectangular shape as shown in FIG. 1. The shape of the light transmissive member 12 in a sectional view can be appropriately selected, for example, substantially rectangular shape as shown in FIG. 2, but preferably a shape whose back surface has an inclined or curved surface broadening from the upper surface side to the lower surface side.

The light guide member 11 covers the lateral surfaces 21 of the light emitting element 10 to guide light emitted from the lateral surfaces 21 to the light transmissive member 12. Providing the light guide member 11 can reduce that light reached from the inside of the light emitting element 10 to the lateral surfaces 21 of the light emitting element 10 reflect at the lateral surface 21, thereby extracting the light to outside the light emitting element 10. Accordingly, the light guide member 11 allows the light emitted from the lateral surface 21 of the light emitting element 10 to be guided to the light transmissive member 12, thereby enhancing emission efficiency of the light emitting device 100.

The light guide member 11 can have a shape appropriately selected, or example, the outer surfaces 25 in FIG. 2 can each have a flat in curved surface. The "curved surface" here means a curved surface convex toward the light reflective member 13, or a curved surface convex toward the light emitting element 10. Shapes of the front surface and the back surface of the light guide member 11 can be the same or a different from each other. As shown in FIG. 2, in the light emitting device 100 according to certain embodiment, the outer surfaces 25 of the light guide member 11 respectively have inclined surfaces outwardly extending from the lateral surfaces of the light emitting elements 10 toward outer edges of the light transmissive member 12. In the case of the curved surface convex toward the light reflective member 13, an effect of the light guide member 11 can be significantly obtained. Accordingly, light entering from the lateral surfaces 21 of the light emitting element 10 into the light guide member 11 can effectively enter the light transmissive member 12 through the second region 24.

As shown in FIGS. 1 and 2, the light guide member 11 in the light emitting device 100 according to certain embodiment covers at least 50% of the lateral surfaces 21 of the light emitting element 10, and at least 50% of the second region 24 of the light transmissive member 12. The light guide member 11 preferably cover at least 70% of the lateral surfaces 21 of the light emitting element 10 and the second region 24 of the light transmissive member 12. Covering most of the part of the lateral surfaces 21 and the second region 24 allows the light emitted from the lateral surface 21 of the light emitting element 10 to efficiently enter into the light guide member 11, thereby enhancing emission efficiency of the light emitting device 100.

As shown in FIG. 2, in the light emitting device 100 according to certain embodiment, a light guide member 11 positioned closer to the front surface 38 of the light emitting device 100 is preferably formed having a certain distance from the front surface 38. In other words, the light reflective member 13 preferably covers periphery of the second region 24 closer to the front surface 38. With this structure, light entering from the lateral surfaces 21 of the light emitting element 10 to the guide member 11a is less likely to enter the light transmissive member 12, thereby alleviating the light to exit from the front surface 38 of the light emitting device 100. This can reduce an occurrence of color non-uniformity of the light emitting device 100. The "certain distance" herein means the distance with which light is less likely to pass through. The "certain distance" can be appropriately selected depending on the size of the light emitting device or the configuration of the light emitting element.

On the other hand, a light guide member 11b positioned closer to the back side preferably covers the second region 24 in wider area. For example, center of the light transmissive member 12 in the Z direction preferably substantially coincides with the center of the light emitting element 10 or closer to the back side surface than the center thereof. The light guide member 11b on the back surface side also preferably covers the second region 24 in wider area than that the light guide member 11a on the front surface 38 side does. More preferably, the light member 11b entirely covers the second region 24 close to the back surface. This allows light emitted from the lateral surfaces 21 of the light emitting element 10 to be efficiently taken into the light guide member 11b, thereby increasing emission efficiency.

As shown in FIG. 1, preferably, the light guide member 11 on the lateral surface side of the light emitting device 100 entirely covers the lateral surfaces 21 of the light emitting element 10 and the region 24 of the light transmissive member 12. This allows light emitted from the lateral surfaces 21 of the light emitting element 10 to be efficiently taken into the light guide member 11, thereby increasing emission efficiency. As shown in FIG. 1, the light transmissive member 12 is preferably disposed on the light emitting element 10 such that the center in the X direction of the light emitting element 10 substantially coincides with the center in the X direction of the light transmissive member 12 along the Y direction, and the light guide member 11 is preferably provided such that shapes and covering surface areas are substantially the same on both of right-side and left-side lateral surfaces. Accordingly, the light entering from the lateral surfaces 21 of the light emitting element 10 to the light guide member 11 uniformly enters into lateral surfaces in right-side and left-side of the light transmissive member 12, and exits from the light extraction surface 18 of the light transmissive member 12 uniformly in right-side and left-side, resulting the light emitting device with improved color non-uniformity.

In the light emitting device 100 according to certain embodiment, the front surface 38 and the lower surface of the light emitting device 100 define an angle of from 80° to 100°. This can alleviate generation of gap between the light guide plate and the light extraction surface 18 after a light guide plate for backlight is disposed on the light extraction surface 18, and light exiting from the light extraction surface 18 can efficiently enter the light guide plate, thereby realizing a backlight with good emission efficiency.

The light reflective member 13 covers part of the lower surface 10b and the lateral surfaces 21 of the light emitting element 10 that are not covered by the light guide member 11. With this structure, light that is emitted from the lower surface 10b and the lateral surfaces 21 of the light emitting element 10 and does not enter into the light guide member 11, can be reflected by the light reflective member 13 to enter the light transmissive member 12. The light reflective member 13 covers the outer surfaces 25 of the light guide member 11, therefore, light entering from the lateral surfaces 21 of the light emitting element 10 into the light guide member 11 can be reflected by the light reflective member 13, and guided to the light transmissive member 12 to obtain the light emitting device 100 with good emission efficiency.

The light reflective member 1 covers an timer surface of the light transmissive member 12, lateral surfaces except for the light extraction surface 18 of the light transmissive member 12, and part of the second region 24 that is not covered by the light guide member 11. This can realize a light emitting device with good contrast, in other words, good distinguishability between a light emitting region and a non-light-emitting region.

Modification

A shown in FIG. 3, the light emitting device 200 do not include base member. Other than this, the light emitting device 200 is substantially the same as or a similar to the foregoing embodiment. The light emitting device 200 can have even more reduced thickness because it does not have a base member.

Method of Manufacturing Light Emitting Device

The following describes a method of manufacturing a light emitting device according to the present disclosure referring to the drawings. The same terms are used for components before and after curing or cutting.

First Method Manufacturing Light Emitting Device

The method of manufacturing the light emitting device 100 includes: disposing a plurality of light emitting elements separated from each other; disposing a light transmissive member over adjacent two of the light emitting elements; disposing a light guide member covering lateral surfaces of the adjacent two light emitting elements, and part of a lower surface of the light transmissive member; disposing a light reflective member covering the adjacent two light emitting elements, an upper surface of the light transmissive member, and the light guide member; and cutting the light member and the light reflective member between the adjacent two light emitting elements.

With this manufacturing method, the light emitting device 100, in which light emitted from the lateral surfaces 21 of the light emitting elements 10 enter into the light guide member 11, and is reflected by the light reflective member 13, and is eventually extracted from a light extraction surface 18 of the light transmissive member 12. The light emitting device 100 manufactured by this method can have a good emission efficiency.

1-1. Disposing Light Emitting Element on Base Member

Figure 4A:
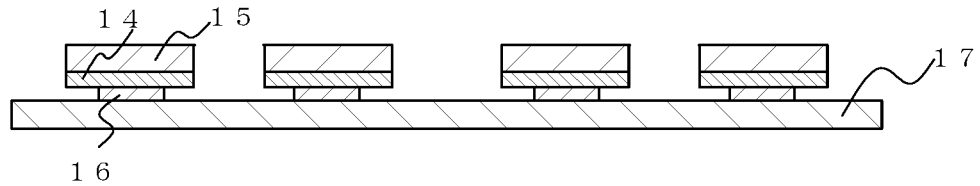
FIG. 4A is a schematic sectional diagram showing a process of an embodiment of a method of manufacturing a light emitting device.

As shown in FIG. 4A, electrodes 16 of the light emitting elements are provided such that the electrodes 16 face the mounting board while the light emitting elements 10 are separated from each other, and are bonded to the base member. Examples of techniques for the bonding include AuSn bonding, solder bonding, Au-bump bonding, con-bump bonding, or bonding using electrically-conductive adhesives, anisotropic conductive pasts, or a anisotropic conductive films. Specifically, AuSn bonding is the most suitable technique from a standpoint of the connection stability or reliability of the connection portion for the timing of the secondary mounting or operation. The interval between the adjacent light emitting elements 10 can be appropriately selected, however, preferably 30 μm to 300 μm, more preferably 50 μm to 150 μm at the light extraction surface 18 side, from a standpoint of the size of the light emitting devices 100 and number of the light emitting devices which can be manufactured from one base member block.

1-2. Providing Light Transmissive Member 12

In the present embodiment, at least one light transmissive member 12 having a sheet shape is provided. The light transmissive member extends in a longitudinal direction and a width direction in a plan view. The tight transmissive member 12 having the sheet shape can be formed using, for example, a wavelength conversion member formed using a liquid resin, and as necessary, a phosphor is mixed therewith, by coating, compression molding, transfer molding, injection molding, splaying, printing, potting, or the like. Alternatively, a fluorescent material formed in a substantially uniform thickness by electrophoretic deposition or the like can be impregnated with a resin to form the light-transmissive member 12. The surface of the light transmissive member 12 can be a flat surface or rough surface. The rough surface can be easily formed, for example, by compression molding, transfer molding, or injection molding. The roughness formed on the surface can enhance adhesion between the light transmissive member 12 and the light reflective member 13, thereby improving reliability of the light emitting device. End surface of the light transmissive member 12 can be an inclined surface or curved surface broadening from the upper surface side to the lower surface side. Having an inclined surface on the back surface of the light transmissive member 12 which is opposite to the light extraction surface 18 an further increase emission efficiency.

The light transmissive member 12 should have a size capable of being disposed over the adjacent two light emitting elements 10 on the base member 17. The adjacent light transmissive member 12 can be separated in a predetermined interval. The interval of the adjacent light transmissive members 12 can be appropriately selected, however, in view of the size of the light emitting device and singulation of the light emitting device, the interval between surfaces of the adjacent light transmissive members 12 facing each other is preferably 30 μm to 300 μm, more preferably 50 μm to 150 μm.

1-3. Disposing Liquid Resin Material

Although not shown in the drawings, resin material for forming the light guide member 11 is disposed on the light transmissive substrate 14 of the light emitting elements 10 mounted on the base member. To dispose the resin material for forming the light guide member 11, for example, the light transmissive substrate 14 of the light emitting elements 10 is brought into contact with resin adjusted in a certain thickness by dispensing, transferring with pin, or using a squeegee. This technique is called dipping. The amount of the liquid resin to be disposed can be appropriately selected, however it is preferably adjusted in sufficient amount to cover the lateral surfaces 21 of the light emitting elements 10, and to form inclined surfaces respectively connecting the lateral surfaces 21 of the light emitting element 10 and the second region 24 of the light transmissive member 12.

1-4. Disposing Light Transmissive Member 12 and Forming Light Guide Member 11

Figure 4B:
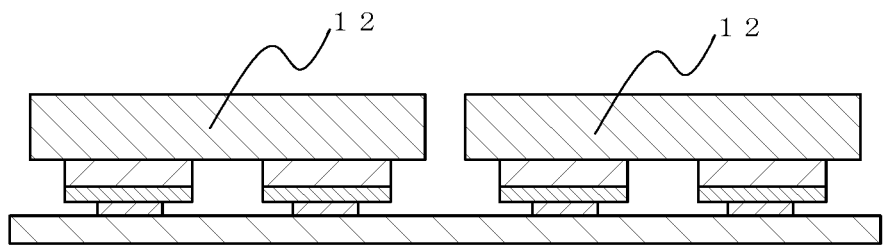
FIG. 4B is a schematic sectional diagram showing a process of the embodiment of the method of manufacturing the light emitting device.
Figure 4C:
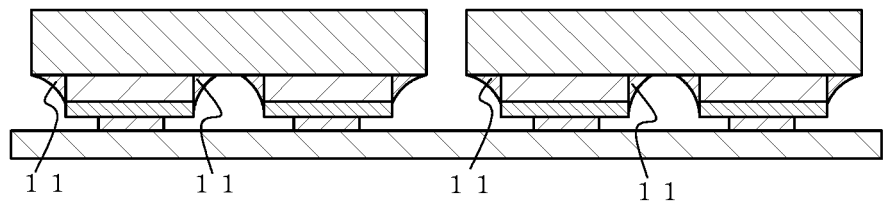
FIG. 4C is a schematic sectional diagram showing a process of the embodiment of the method of manufacturing the light emitting device.
Figure 4D:
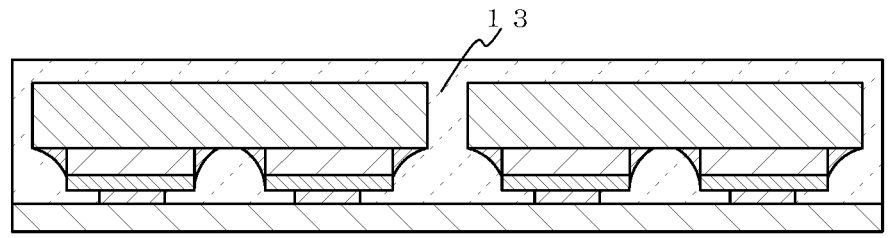
FIG. 4D is a schematic sectional diagram showing a process of the embodiment of the method of manufacturing the light emitting device.

As shown in FIG. 4B, the light transmissive members 12 are disposed over the adjacent two light emitting elements 10. At this timing, as shown in FIG. 4D, the liquid resin material disposed on the light emitting elements 10 is pushed out from the regions between the light emitting elements 10 and the light transmissive member 12. The pushed out liquid resin material covers the lateral surfaces 21 of the light emitting elements 10 and the second region 24 of the light transmissive member 12, and forms the light guide member 11 having the inclined surface connecting the lateral surfaces 21 of the light emitting element 10 and the second region 24.

Thereafter, the liquid resin material is cured by heat or ultraviolet to bond the light emitting elements 10 and the light transmissive member 12 while fixing the shape of the inclined surface of the light guide member 11. Curing of the light guide member 11 can be performed, for example, by heating for 4 hours with an oven set at 150° C.

When the light transmissive member 12 is disposed on the light emitting element 10, the liquid resin material can be remained in the light transmissive member 12 and the light emitting elements 10. With this structure, light emitted from the upper surface 10u of the light emitting elements 10 can be uniform in the cured liquid resin material before entering into the light transmissive member 12, thereby improving color non-uniformity of the light emitted from the light emitting device.

1-5. Forming Light Transmissive Member

In the present disclosure, the outline of the light transmissive member 12 having a sheet shape can be formed in a slightly larger size, and after being disposed on the light emitting elements 10, part of outer edges of the light transmissive member 12 can be removed to adjust its shape. This can reduce variance of the shape of the light transmissive member 12 in forming, or of positioning thereof in disposing. The variance of the shape or positioning of the light transmissive member 12 may cause reduction in the thickness of the light reflective member 13 covering herein. This may cause insufficient light blocking, and the light leakage from the area other than the light extraction surface 18 of the light emitting device 100. Specifically, when the light transmissive member 12 contains one or more phosphors, light leakage from areas other than the light extraction surface 18 may cause color shift. The light emitting device according to the present embodiment can reduce a possibility of such insufficient light blocking, light leakage, and color shift.

Accordingly, the target value or the design value of the thickness of the light reflective member 13 can be smaller, in other words, this forming step can reduce the thickness of the light reflective member 13 including margin which is remained to take into account manufacturing variance, the reducing the thickness of the light emitting device.

Examples of methods of the forming include dicing, process using Thomson blade, laser processing. Among these examples, dicing is preferable because it can accurately term the shape.

1-6. Forming Light Reflective Member 13

Subsequently, as shown in FIG. 4D, the light reflective member 13 is formed to cover the light transmissive member 12, the light emitting element 10, light guide member 11, and the base member 17. Forming the light reflective member 13 can be performed, for example, by printing, potting or molding such as compression molding, transfer molding, or injection molding. Concentration of filler contained in the resin in the light reflective member 13 is high, the fluidity of the light reflective member 13 is reduced. Therefore, compression molding and transfer molding are especially suitable.

1-7. Singulating

Figure 4E:
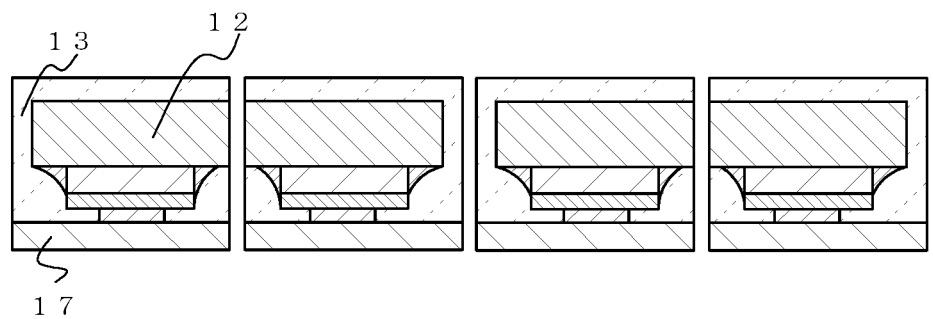
FIG. 4E is a schematic sectional diagram showing a process of the embodiment of the method of manufacturing the light emitting device.

Subsequently, as shown in FIG. 4E, singulating is performed between the adjacent two light emitting elements 10 to obtain a plurality of light emitting device. The light reflective member 13 and the base member 17 are cut between adjacent two light transmissive members 12. The light reflective member 13, the light transmissive member 12, and the base member 17 are cut between the light emitting elements 10 on which the light transmissive member 12 straddles. The cut surface of the light transmissive member 12 becomes the light extraction surface 18 of the light emitting device 100.

Example methods of the cutting include dicing, processing using Thomson blade, laser processing. At the timing of the cutting, employing a point as the reference point used to form the light transmissive member 12 can realize accurate thinning by cutting the light reflective member 13, specifically, by cutting the back surface side of the light reflective member 13 which is opposite side of the light extraction surface 18. Thus, the light emitting device can be downsized.

The steps of the first method of the manufacturing are described above in sequence however, the manufacturing steps do not necessarily be performed in this order. Some of the steps can be performed at the same time, for example, the step 1-2. Providing Light Transmissive Member and 1-3. Disposing Liquid Resin Material can be performed at the same time.

Second Method of Manufacturing Light Emitting Device

The second method of the manufacturing a light emitting device includes: disposing a light guide member covering part of a lower surface of the light transmissive member and the lateral surfaces of adjacent two light emitting elements disposed on a lower surface of a light transmissive member, the lower surface of the light transmissive member being a surface on which the light emitting elements are disposed; disposing a light reflective member covering an upper surface of the light transmissive member and the adjacent two light emitting elements, the upper surface of the light transmissive member being opposite to the lower surface thereof; and cutting the light transmissive member and the light reflective member between the adjacent two light emitting elements.

The second method of manufacturing differ from the first method of manufacturing in that the second method can produce a light emitting device in which the base member 17 is not included.

Figure 5A:
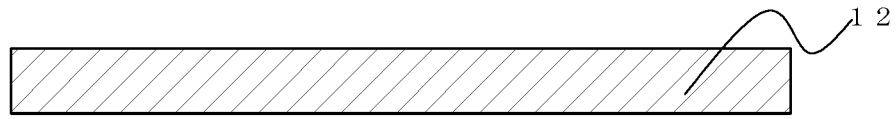
FIG. 5A is a schematic sectional diagram showing a process of a second embodiment of a method of manufacturing a light emitting device.
Figure 5B:
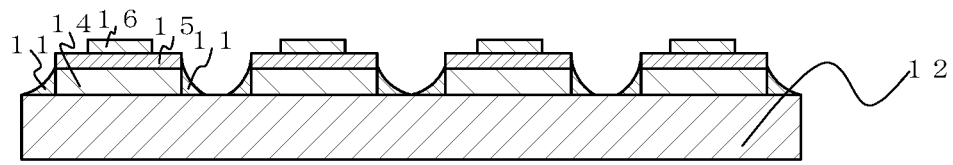
FIG. 5B is a schematic sectional diagram showing a process of the second embodiment of the method of manufacturing the light emitting device.
Figure 5C:
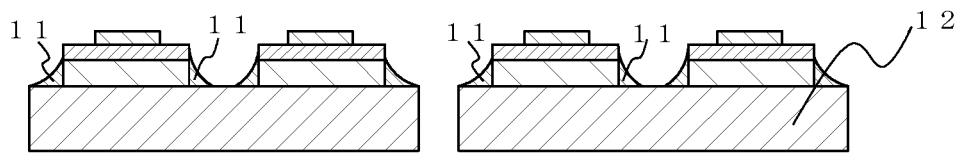
FIG. 5C is a schematic sectional diagram showing a process of the second embodiment of the method of manufacturing the light emitting device.
Figure 5D:
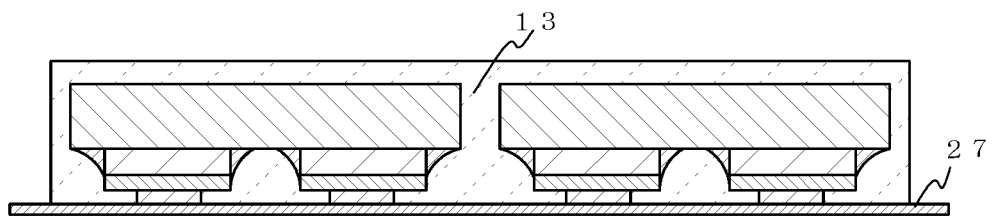
FIG. 5D is a schematic sectional diagram showing a process of the second embodiment of the method of manufacturing the light emitting device.
Figure 5E:
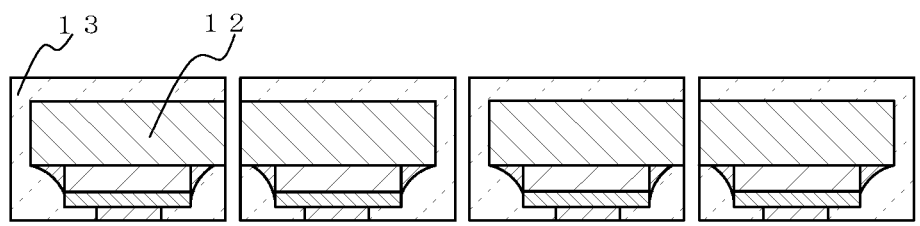
FIG. 5E is a schematic sectional diagram showing a process of the second embodiment of the method of manufacturing the light emitting device.

In the second method of manufacturing, the upper surface and the lower surface of the light transmissive member 12 refers the upper surface and the lower surface of the light transmissive member 12 as shown in the position of FIGS. 5D and 5E.

2-1. Mounting Light Emitting Element 10

As shown in FIG. 5A, ale light transmissive member 12 having a sleet shape is provided. Subsequently, liquid resin material for forming the light guide member 11 is disposed on the lower surface of the light transmissive member 12. Disposing method and disposing amount of the liquid resin material are the same as that of the first method of manufacturing. As shown in FIG. 5B, a plurality of light emitting elements 10 on the light transmissive member 12 via the liquid resin material. At this timing, the liquid resin material disposed on the light transmissive member 12 is pushed out from the region between the light emitting elements 10 and the light transmissive member 12, and form inclined surfaces respectively connecting lateral surfaces 21 of the light emitting elements 10 and a second region 24 of the light transmissive member 12. Thereafter, the light guide member 11 is cured by the method described in the step 1-5. Forming Light Transmissive Member of the first method.

2-2. Cutting Light Transmissive Member 12

As shown in FIG. 5C, the light transmissive member 12 is cut such that two light emitting elements 10 are disposed on one light transmissive member 12. The cutting can be performed, for example, by dicing, processing using Thomson blade, laser processing.

In the second method of manufacturing, the light transmissive member 12 is cut every two light emitting elements 10 after disposing the light emitting elements 10 on the light transmissive member 12, however, the method of the manufacturing is not limited thereto. For example, the transmissive member 12 can be cut into pieces which are large enough to allow two light emitting elements 10 to be disposed, followed by disposing the light emitting elements 10.

2-3. Forming Light Reflective Member 13

Subsequently, as shown in FIG. 5D, the workpieces are transferred on a transfer sheet 27 such that electrodes 10 of the light emitting elements 10 face the transfer sheet 27. Then the light reflective member 13 is formed to cover the light emitting elements 10, the light transmissive member 12, and the light guide member 11. The light reflective member 13 is preferably formed by the same method as those described in the step 1-7. Singulating.

The transfer sheet 27 can be formed using, for example, resin film, metal board, ceramic board as a single component, or composite member thereof. The transfer sheet 27 can be a rigid sheet or flexible sheet. The transfer sheet 27 is removed after the light emitting device is manufactured by the series of manufacturing steps.

Instead of transferring the workpieces on the transfer sheet 27 such that the electrodes 16 of the light emitting elements 10 face the transfer sheet 27, transferring can be performed by disposing the workpieces after the step 2-2. Cutting Light Transmissive Member 12 on the transfer sheet 27 such that the upper surface of the light transmissive member 12 faces the transfer sheet 27. Thereafter the light reflective member 13 can be formed to cover the light emitting elements 10, the light transmissive member 12, and the light guide member 11 such that part of each of the electrodes 10 is exposed.

2-4. Singulating

Subsequently, as shown in FIG. 5E, the workpieces are cut between the adjacent two light emitting elements 10 to obtain a plurality of light emitting device. In the case where the light transmissive member 12 does not straddle two light emitting elements 10, the light reflective member 13 is cut between the light emitting elements 10. In the case where the light transmissive member 12 straddles two light emitting elements 10, the light reflective member 13 and the light transmissive member 12 are cut between the two light emitting elements 10. A cut surface of the light transmissive member 12 serves as a light extraction surface 18 of the light emitting device. The cutting can be performed by the same or a similar method used in the step 1-7. Singulating. After the singulation, the transfer sheet 27 can be removed.

The steps of the second method of the manufacturing is described above in sequence, however, the manufacturing steps do not necessarily be performed in this order. For example, the order of the steps can be changed, or some of the steps can concurrently be performed. Except for the steps described in the second method of manufacturing, the manufacturing method is the same as that of the first method of manufacturing. In the second method of manufacturing, a base member is not required, thereby enabling production of the light emitting device with reduced thickness.

The following describes the components of a light-emitting device according to embodiments of the present disclosure.

Light Emitting Element 10

The light emitting element is preferably a semiconductor light emitting element. An example of the semiconductor light emitting element includes a light emitting diode (LED) chip. The semiconductor light emitting element can include a semiconductor layered body including at least light omitting structure and a pair of electrodes, and can further include a light transmissive substrate. The light emitting element preferably includes a positive (p) and negative (n) electrodes on the same surface. The light emitting element is a flip-chip (i.e., face down) mounting type, the primary emission surface is opposite to the surface on which the electrodes are formed.

Semiconductor Layered Body 15

The semiconductor layered body preferably includes at least an n-type semiconductor layer, a p-type semiconductor layer, and the active layer interposed therebetween. For the semiconductor material, nitride semiconductor capable of efficiently emitting light having a short wavelength which readily excites fluorescent substance. An example of a typical nitride semiconductor is one that is represented by $In_xAl_yGa_{1-X-Y}N$ ($0 \le X$, $0 \le Y$, $X+Y \le 1$). Alternative examples include zinc sulfide, zinc selenide, and silicon carbide.

Light Transmissive Substrate 14

For the light transmissive substrate, a growth substrate allowing epitaxial growth of the semiconductor layer. Examples of the light transmissive substrate include an insulating substrate such as sapphire ($Al_2O_3$) or spinel ($MgAl_2O_4$), and a nitride-based semiconductor substrate. In the case where the light transmissive substrate 14 having light transmissivity such as sapphire substrate is employed for a growth substrate of the semiconductor layer, the light transmissive substrate 14 can be included in the light emitting device without being removed.

The light transmissive substrate can have surface roughness including a plurality of recesses and protrusions on the surface.

Electrodes 16, 16a, 16b

The electrodes can be formed using pieces of metal or metal alloy. For example, at least one kind of materials selected from the group consisting of gold, silver, copper, iron, tin, platinum, rhodium, titan, nickel, paradigm, aluminum, tungsten, chromium, molybdenum, and alloy thereof. Among these examples, copper is preferable due to its good thermal conductivity and relatively low cost. Gold or a gold alloy is also preferable, because it has a good bondability due to the properties that is chemically stable and is less likely to undergo surface oxidation. The electrodes can have a film formed of gold or silver on the surface thereof in view of the solder bondability.

Light Transmissive Member 12

The light transmissive member includes a light transmissive material. Examples of the light transmissive materials include light transmissive resins and glass. Specifically, light transmissive resins are preferable, for example, thermosetting resins such as silicone resins, modified silicone resins, epoxy resins, and phenol resins; or thermoplastic resins such as polycarbonate resins, acrylic resins, methylpentene resins, or polynorbornene resins. Specifically, silicone resins are suitable because it has good heat and light resistance.

The light transmissive member can contain various types of fillers for the purpose of adjusting the viscosity, or the like.

The light transmissive member can be a wavelength conversion member in which at least one phosphor in addition to the light transmissive material. The phosphor can be that is capable of excitation by light from the light emitting element. Examples of the phosphor capable of excitation by blue light emitting elements or ultraviolet light elements include: cerium-activated yttrium aluminum garnet (Ce:YAG)-based phosphors; cerium-activated lutetium aluminum garnet (Ce:LAG-based phosphors; europium and/or chromium-activated nitride-containing calcium aluminosilicate ($CaO-Al_2O_3-SiO_2$)-based phosphors; europium-activated silicate (($Sr,Ba)_2SiO_4$)-based phosphors; nitride-based phosphors such as β-SiAlON phosphors, CASN-based phosphors or SCASN-based phosphors; KSF-based phosphors ($K_2SiF_6$:Mn); sulfide-based phosphors; quantum dot; and the like. Combining such phosphors and the blue light emitting element or ultraviolet light emitting element can realize production of a light emitting device, that emit light of various colors (e.g., white-color based light emitting device).

The wavelength conversion member can contain various types of fillers for the purpose of adjusting the viscosity, or the like.

The light transmissive member 12 can be single layer or multilayer stacked in the thickness direction. In the case of the light transmissive member configured by multilayer, different types of base material can be used in the respective layers, or different types of fluorescent substances can be used in the respective layers. The outermost layer can be a layer free of the fluorescent substances, thereby alleviating degradation of the fluorescent substances due to, for example, external air.

Light Guide Member 11, 11a, 11b

The light guide member can be formed using a liquid resin material that has light transmissivity, is capable of guiding of light emitted from the light emitting element, and is capable of bonding the light emitting element and the light transmissive member. The liquid resin material is preferably a material that is a liquid state before being cured, and capable of bonding by curing. A base material of the liquid resin material can be at least one kind of materials selected from the group consisting of a silicone resin, an epoxy resin, a phenol resin, a polynorbornene resin, an acrylic resin, or modified resins thereof. Among these examples, silicone resins or modified silicone resins are preferable due to good heat and light resistant. Specific examples of silicone resins include dimethyl silicone resin, phenylmethyl silicone resin, and diphenyl silicone resins.

For example, various types of fillers can be added in the light guide member in order to adjust the refractive index of the light guide member, or to adjust the viscosity of the uncured light guide member (i.e., the liquid resin material).

Light Reflective Member 13

The light reflective member 13 can be formed using a light reflective resin. The light reflective resin preferably has at least 70%, more preferably at least 80%, even more preferably at least 90% of reflectance to the peak emission wavelength of light emitted from the light emitting element. Light reaching the light reflective member is reflected to the light reflective member, and travels toward the light extraction surface of the light emitting device, thereby increasing light extraction efficiency of the light emitting device.

The light transmissive member can be, for example, a light transmissive resin in which light reflective substances are dispersed. Examples of the light reflective substances include titanium oxide, silicon dioxide, zirconium dioxide, potassium titanate, alumina, aluminum nitride, boron nitride, mullite, and the like. Particle of the light reflective substances can have granular, fiber, or flake shape. The particles having fiber shapes is preferable because it can be expected that a light reflective substances having a fiber shape can have a low thermal expansion rate Particularly preferable examples of materials usable for the light reflective member include thermosetting resins such as silicone resin, modified silicone resin, epoxy resin, phenol resin.

Base Member 17

The base member can be one that includes a leadframe configured with pairs of metal plate, at least a base, and pairs of connection terminals corresponding to the positive and negative terminals disposed on the base. In the case of employing a base member, the connection terminals are usually on a first main surface of the base. The first main surface here means one of the main surfaces of the base or the base member. The shape of the base member is not specifically limited, however, it can be the shape corresponding to the shape of the base described below. For example, preferably at least the first main surface preferably extends in the longitudinal direction, and more preferably the base member has a width perpendicular to the longitudinal direction.

Base

The base can be formed by materials appropriately selected. Examples of materials of the base include metals, ceramics, resins, dielectric materials, pulp, glass, paper, composite materials thereof, or composite materials thereof with electrical conductive materials such as metal, carbon. Examples of metals include copper, iron, nickel, chromium, aluminum, silver, gold, titanium, or alloys containing thereof. Examples of resins include epoxy resins, bismaleimide triazine (BT) resins, polyimide resins. Resin materials can contain white pigment such as titanium oxide. Among these examples, ceramics or composite resins are preferable.

Examples of the ceramic include aluminum oxide, aluminum nitride, zirconium oxide, zirconium nitride, titanium oxide, titanium nitride, and mixtures of these ceramic materials. Among these examples, aluminum nitride is preferable due to its good heat dissipation. As a composite resin, glass-epoxy resin is preferably used. The base can be one that has an appropriate mechanical strength, or has a flexibility.

The "light transmissive/transmissivity" here refers to a transmittance of preferably 60% or higher, more preferably 70% or higher, even more preferably 80% or higher for the peak emission wavelength of the light emitting element.

Certain embodiments of the present disclosure are described above as examples. It is, however, expressly noted that the present invention is not limited to these embodiments, but the principles of the present invention defined herein can be applied to other embodiments and applications without departing from the spirit and scope of the invention.

What is claimed is:

1. A light emitting device comprising:
a light emitting element;
a light transmissive member disposed on an upper surface of the light emitting element, the light transmissive member having a lower surface including a first region facing the light emitting element and a second region positioned outside of the first region;
a light guide member covering a lateral surface of the light emitting element and the second region of the lower surface of the light transmissive member;
a light reflective member covering the light emitting element, an upper surface of the light transmissive member, and the light guide member; and
a resin material disposed between the light emitting element and the light transmissive member, wherein
one of lateral surfaces of the light transmissive member is exposed from the light reflective member with the rest of the lateral surfaces of the light transmissive member being covered by the light reflective member.

2. The light emitting device according to claim 1, wherein the light guide member has an inclined surface extending outward from the lateral surface of the light emitting element toward an outer edge of the light transmissive member.

3. The light emitting device according to claim 1, wherein the light transmissive member has a larger area than the light emitting element in a top view.

4. The light emitting device according to claim 1, wherein the light emitting element extends in a longitudinal direction and a width direction in a top view, and
a ratio of a length of a side of the width direction to a length of a side of the longitudinal direction is 3 to 10.

5. The light emitting device according to claim 1, wherein the light emitting element is disposed on a base member.

6. The light emitting device according to claim 1, wherein one of the lateral surfaces of the light transmissive member on a back side of the light emitting device has an inclined or curved surface broadening from an upper surface side to a lower surface side.

7. The light emitting device according to claim 1, wherein an area of the second region of the lower surface of the light transmissive member covered by the light guide member on a front side of the light emitting device is smaller than an area of the second region of the lower surface of the light transmissive member covered by the light guide member on a back side of the light emitting device.

8. The light emitting device according to claim 1, wherein the resin material is disposed on a light transmissive substrate of the light emitting element, the resin material being the same as a material of the light guide member.

9. The light emitting device according to claim 1, wherein the light transmissive member is a wavelength conversion member including light transmissive material and at least one phosphor.

10. A method of manufacturing a light emitting device, comprising:
disposing a plurality of light emitting elements separated from each other;
disposing a light transmissive member to straddle adjacent two of the light emitting elements;
removing a part of an outer edge of the light transmissive member in a top view, after the disposing of the light transmissive member;
disposing a light guide member covering lateral surfaces of the adjacent two of the light emitting elements, and a part of a lower surface of the light transmissive member;
disposing a light reflective member covering the adjacent two of the light emitting elements, an upper surface of the light transmissive member, and the light guide member; and
cutting the light reflective member and the light transmissive member between the adjacent two of the light emitting elements.

11. The method of manufacturing a light emitting device according to claim 10, wherein
the disposing of the light emitting elements includes disposing the light emitting elements on a base member so that electrodes formed on a lower surface of each of the light emitting elements face the base member.

12. The method of manufacturing a light emitting device according to claim 10, wherein
the cutting of the light reflective member and the light transmissive member includes exposing the light transmissive member on one of lateral surfaces of the light emitting device with an exposed surface of the light transmissive member being spaced apart from an upper edge of the light emitting device.

13. The method of manufacturing a light emitting device according to claim 10, wherein
the cutting of the light reflective member and the light transmissive member includes cutting of the light reflective member and the light transmissive member so that an upper surface of the light transmissive member is covered by the light reflective member while one of lateral surfaces of the light transmissive member coincides a corresponding one of lateral surfaces of the light emitting device.

14. The method of manufacturing a light emitting device according to claim 10, wherein
the cutting of the light reflective member and the light transmissive member includes exposing the light transmissive member so that an exposed surface of the light transmissive member serves as a light extraction surface of the light emitting device.

15. A light emitting device comprising:
a light emitting element;
a light transmissive member disposed on an upper surface of the light emitting element, the light transmissive member having a lower surface including a first region facing the light emitting element and a second region positioned outside of the first region;

a light guide member covering a lateral surface of the light emitting element and the second region of the lower surface of the light transmissive member; and a light reflective member covering the light emitting element, an upper surface of the light transmissive member, and the light guide member, wherein one of lateral surfaces of the light transmissive member is exposed from the light reflective member with the rest of the lateral surfaces of the light transmissive member being covered by the light reflective member, and the light reflective member includes a thermosetting resin selected from a group consisting of silicone resin, modified silicone resin, epoxy resin, and phenol resin.

16. The light emitting device according to claim 15, wherein the light guide member has an inclined surface extending outward from the lateral surface of the light emitting element toward an outer edge of the light transmissive member.

17. The light emitting device according to claim 15, wherein the light transmissive member has a larger area than the light emitting element in a top view.

18. The light emitting device according to claim 15, wherein the light emitting element extends in a longitudinal direction and a width direction in a top view, and a ratio of a length of a side of the width direction to a length of a side of the longitudinal direction is 3 to 10.

19. The light emitting device according to claim 15, wherein the light emitting element is disposed on a base member.

20. The light emitting device according to claim 15, wherein one of the lateral surfaces of the light transmissive member on a back side of the light emitting device has an inclined or curved surface broadening from an upper surface side to a lower surface side.

21. The light emitting device according to claim 15, wherein an area of the second region of the lower surface of the light transmissive member covered by the light guide member on a front side of the light emitting device is smaller than an area of the second region of the lower surface of the light transmissive member covered by the light guide member on a back side of the light emitting device.

22. The light emitting device according to claim 15, wherein the light transmissive member is a wavelength conversion member including light transmissive material and at least one phosphor.

* * * * *

UNITED STATES PATENT AND TRADEMARK OFFICE
CERTIFICATE OF CORRECTION

PATENT NO.         : 10,985,298 B2
APPLICATION NO.    : 16/109177
DATED              : April 20, 2021
INVENTOR(S)        : Tadao Hayashi Page 1 of 1

It is certified that error appears in the above-identified patent and that said Letters Patent is hereby corrected as shown below:

On the Title Page

In item (73) Assignee, delete "NICHSA CORPORATION", and insert -- NICHIA CORPORATION --.

Signed and Sealed this
Eighth Day of June, 2021

Drew Hirshfeld
*Performing the Functions and Duties of the*
*Under Secretary of Commerce for Intellectual Property and*
*Director of the United States Patent and Trademark Office*